United States Patent
Tseng et al.

(10) Patent No.: US 6,713,388 B2
(45) Date of Patent: Mar. 30, 2004

(54) METHOD OF FABRICATING A NON-VOLATILE MEMORY DEVICE TO ELIMINATE CHARGE LOSS

(75) Inventors: Uway Tseng, Tai-Chung Hsien (TW); Ching-Yu Chang, I-Lan Hsien (TW); Kent Kuohua Chang, Taipei (TW)

(73) Assignee: Macronix International Co. Ltd., Hsin-Chu (TW)

( * ) Notice: Subject to any disclaimer, the term of this patent is extended or adjusted under 35 U.S.C. 154(b) by 175 days.

(21) Appl. No.: 10/063,199

(22) Filed: Mar. 28, 2002

(65) Prior Publication Data

US 2003/0003658 A1 Jan. 2, 2003

(51) Int. Cl.$^7$ .............................. H01L 21/31
(52) U.S. Cl. ...................... 438/673; 438/639
(58) Field of Search ............... 438/625, 637, 438/639, 666, 673

(56) References Cited

U.S. PATENT DOCUMENTS 5,814,862 A * 9/1998 Sung et al. ............ 257/344
5,874,359 A * 2/1999 Liaw et al. ............ 438/640

* cited by examiner

Primary Examiner—David Nelms
Assistant Examiner—David Vu
(74) Attorney, Agent, or Firm—Winston Hsu (57) ABSTRACT

A memory device is formed on a silicon substrate. A blocking layer is thereafter formed to cover a stacked gate of the memory device. A gettering layer is formed on the blocking layer followed by planarizing of the gettering layer to a predetermined thickness. A first barrier layer is then formed on the gettering layer. A contact hole is formed to penetrate through the first barrier layer, the gettering layer and the blocking layer down to the surface of the memory device. Following that, a second barrier layer is created to cover the first barrier layer and the contact hole. Finally, portions of the second barrier layer are etched back to make a barrier spacer on the side wall of the contact hole. Therein, the first barrier layer and the barrier spacer prevent mobile atoms from vertically diffusing and laterally diffusing, respectively, into the memory device.

17 Claims, 8 Drawing Sheets

METHOD OF FABRICATING A NON-VOLATILE MEMORY DEVICE TO ELIMINATE CHARGE LOSS

BACKGROUND OF INVENTION

1. Field of the Invention

The present invention relates to a method of fabricating a non-volatile memory device with high data retention ability, and more particularly, to a method of fabricating a non-volatile memory device to prevent diffusion of mobile hydrogen atoms and mobile ions so as to eliminate charge loss from the memory device.

2. Description of the Prior Art

In semiconductor processing, after completion of back-end processes like metallization and planarization, the main frames of the ICs are formed on the semiconductor. These ICs, after having just completed the back-end processing are easily damaged by inadvertent collision or long-term exposure to humidity and moisture. In addition, diffusion of alkali metallic ions may affect the characteristics of the IC elements. Therefore, before performing a package process, a gettering layer or a passivation layer is required to cover the semiconductor wafer, so as to protect the underlying ICs. Gettering materials, such as phosphosilicate glass (PSG) and borophosphosilicate glass (BPSG), are most often used.

With the increasing integration and the shrinking element size of the ICs, effects of short channel, hot carriers, and diffusion of charged impurity ions and mobile ions become more rampant. Take a non-volatile memory for example, that includes an erasable and programmable read only memory (EPROM), a flash memory and an electrically erasable programmable read only memory (EEPROM), with the data retention ability of the memory cells often decreasing at high temperature. Mobile hydrogen atoms are thought to penetrate the gettering layer and diffuse into the floating gate of the non-volatile memory, thus resulting in a charge loss within the floating gate.

However, diffusion of the free hydrogen atoms may also bring advantages under some conditions. For example, hydrogen atoms combine the dangle bonds on the interface of the gate oxide layer and the silicon substrate, forming a Si—H covalent bond or a Si—OH bond. Since dangle bonds have been reduced, a threshold voltage of the MOS transistors may be adjusted as a result. It is unfortunate that Si—H covalent bonds or Si—OH bonds of the non-volatile memory device are easily broken by high-speed electrons injecting into the floating gate. As a result, hot carriers effects are produced, and hydrogen atoms may penetrate the gate oxide layer to diffuse into the floating gate.

In order to prevent mobile atoms from affecting characteristics of the MOS transistors or memory cells, Mehta et al. (U.S. Pat. No. 6,071,784) provides a method of annealing the silicon nitride layer and silicon oxy-nitride layer so as to eliminate charge loss from non-volatile memory devices. Mehta et al. forms a barrier layer or an etch stop layer to cover the MOS device. Following that, high-temperature annealing at 750° C. is used to remove mobile atoms from the barrier layer or the etch stop layer. A dielectric layer is then formed on the barrier layer or the etch stop layer. It is, however, a disadvantage of this process to add an extra high-temperature annealing process during the back-end process of semiconductor products, so as to alter characteristics of semiconductor elements. In addition, Mehta et al. neglects the possibility that mobile hydrogen atoms and mobile ions may diffuse from a contact hole into the semiconductor elements.

SUMMARY OF INVENTION

It is therefore an objective of the present invention to provide a semiconductor process to eliminate charge loss and improve the data retention ability of a non-volatile memory, without the use of a high-temperature thermal process to anneal a barrier layer within the non-volatile memory.

It is another objective of the present invention to provide a method of fabricating a non-volatile memory device to effectively prevent diffusion of the mobile ions or the hydrogen atoms into the memory device.

According to this invention, a memory device is formed on a silicon substrate. A blocking layer is thereafter formed to cover a stacked gate of the memory device. A gettering layer is formed on the blocking layer followed by planarizing of the gettering layer to a predetermined thickness. A first barrier layer is then formed on the gettering layer. A contact hole is formed to penetrate through the first barrier layer, the gettering layer and the blocking layer down to the surface of the memory device. Following that, a second barrier layer is formed to cover the first barrier layer and the contact hole. Finally, portions of the second barrier layer are etched back to form a barrier spacer on the side wall of the contact hole. Therein, the first barrier layer and the barrier spacer prevent mobile atoms from vertically diffusing and laterally diffusing, into the memory device.

In brief, the present invention has advantages of:(1) effectively preventing effects of mobile atoms in the memory device, especially in the floating gate;(2) elimination of an unnecessary high-temperature annealing process; and(3)decreasing the thickness of the gettering layer so as to decrease the aspect ratio of the contact hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
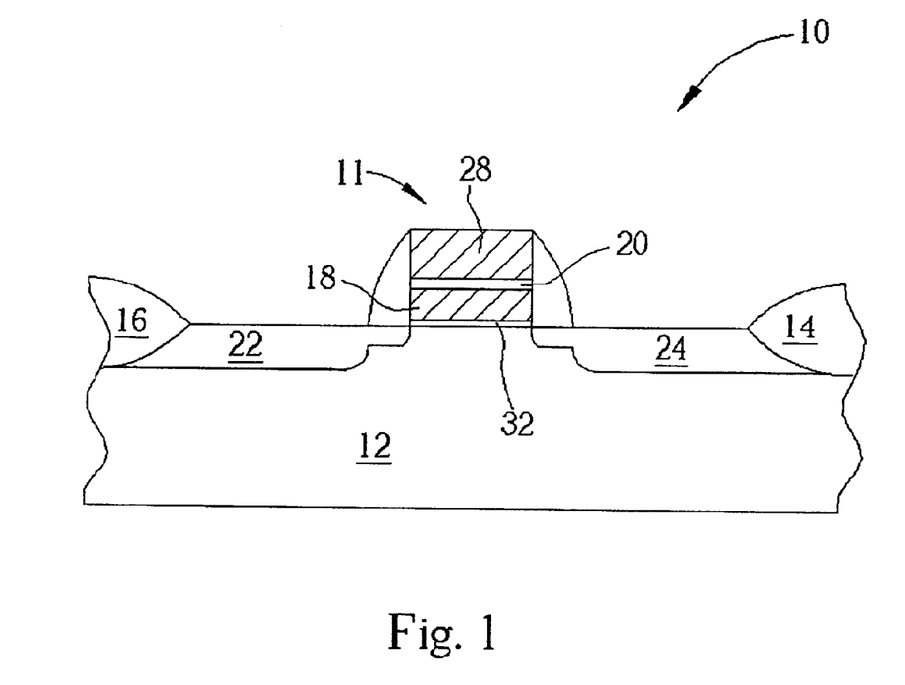
FIG. 1 to FIG. 6 are schematic diagrams of a first embodiment of the present invention.

FIG. 1 to FIG. 6 are schematic diagrams of a first embodiment of the present invention. As shown in FIG. 1, a cross-sectional view of a region 10 of a non-volatile memory device is enlarged. The region 10 is insulated by field oxide layers 14 and 16. To emphasize the features of the present invention, other regions of the non-volatile memory device, such as a periphery region or other memory cells, are not shown in FIG. 1 to FIG. 6. Alternatively, the region 10 can be insulated using other electrical isolation techniques, such as shallow trench isolation (STI).

A first step of the present invention comprises forming a stacked gate 11 on a silicon substrate 12 within the region 10. The stacked gate 11 comprises a floating gate 18, an ONO dielectric layer 20 positioned on the surface of the floating gate 18, and a control gate 28 stacked on the surface of the ONO dielectric layer 20. The floating gate 18 functions to storage charges. A gate oxide layer 32 is formed underlying the floating gate 18, so as to insulate the floating gate 18 from the silicon substrate 12. A source 22 and a drain 24 are formed within the silicon substrate 12 at respective sides of the stacked gate 11. As methods of fabricating the structure of the stacked gate 11 are not the main feature of the present invention and are well known by those in the art, detail steps for forming the stacked gate are not depicted. In addition to the stacked structure, other similar structure, such as a split-gate flash memory, may also be applied in the fabrication of the present invention memory device.

Figure 2:
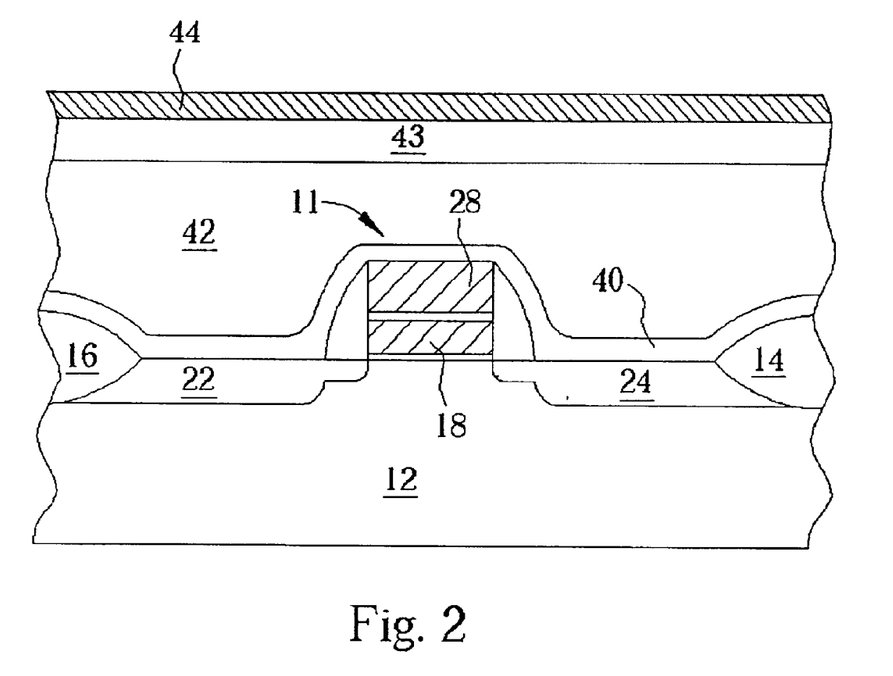

Subsequently, as shown in FIG. 2, a chemical vapor deposition (CVD) is performed to deposit a blocking layer 40 to cover the stacked gate 11, the source 22, the drain 24 and the other regions on the silicon substrate 12. The blocking layer 40 can be formed of at least one selected from the group consisting of undoped silicate glass (USG), LP-TEOS, and PE-TEOS. A gettering layer 42 is then formed on the surface of the blocking layer 40. The gettering layer 42, having a thickness of 13K to 15K angstroms (Å), is formed of PSG, BPSG or other gettering dielectric materials. In a better embodiment of the present invention, PSG is preferably used to form the gettering layer 42. The blocking layer 40 functions to prevent the impurities such as boron and phosphorus atoms in the gettering layer 42 from diffusing into the stacked gate 11.

The gettering layer 42 of PSG or BPSG is formed by atmospheric pressure CVD (APCVD) or plasma-enhanced CVD (PECVD), with a mixture of $B_2F_6$/TEB (tri-ethyl borate), $PH_3$/TMPO (tri-methyl phosphate), ozone and TEOS (tetra-ethyl ortho-silicate) as reactive gases at a temperature of 400 to 550° C. TEB, TMPO and TEOS gases are in liquid state under a constant pressure and room temperature. Thus, a bubbler is required using nitrogen or helium gas as a carrier gas to introduce TEB, TMPO or TEOS into a CVD reactor (not shown).

Still referring to FIG. 2, after the gettering layer 42 is deposited, a planarization process, such as chemical mechanical polishing (CMP), is performed to planarize the gettering layer 42. The thickness of the planarized gettering layer 42 is decreased to between 7000 and 9000 angstroms approximately. In a better embodiment of the present invention for example, after the CMP process, the distance from the top of the stacked gate 11 to the surface of the gettering layer 42 ranges from 2000 to 4000 angstroms. The preferred distance is suggested as 3000 angstroms. As a result, the thickness of the gettering layer 42 is decreased to a minimum, so as to decrease a contact hole's aspect ratio formed thereafter.

Subsequently, an oxide layer 43 and a barrier layer 44 are formed, respectively, on the surface of the gettering layer 42. The oxide layer 43, having a thickness of 2000 angstroms, is formed by PECVD and is used to fill the scratches, resulting from CMP, on the gettering layer 42. The barrier layer 44 is made from silicon oxy-nitride, silicon nitride, or materials that can prevent diffusion of the mobile atoms. Alternatively, the barrier layer 44 can be made from photoabsorptive materials, such as an anti-reflective coating (ARC) or a dielectric anti-reflective coating (DARC). In the present invention, silicon oxy-nitride is suggested to form the barrier layer 44.

The silicon oxy-nitride layer 44 is formed by LPCVD or PECVD, with a mixture of silane, nitrous oxide ($N_2O$) and nitrogen gas as reactive gases, at a reactive pressure of 5 to 6 Torr and a reactive temperature of between 350 to 450° C. Using these process parameters, the silicon oxy-nitride layer 44 is formed with a reflection index (RI) of 248 nm UV light ranging from 2 to 2.4 and a dielectric constant (k) ranging from 0.4 to 0.6. The thickness of the silicon oxy-nitride layer 44 ranges from 300 to 1000 angstroms, while a preferred thickness is suggested as 500 angstroms.

Figure 3:
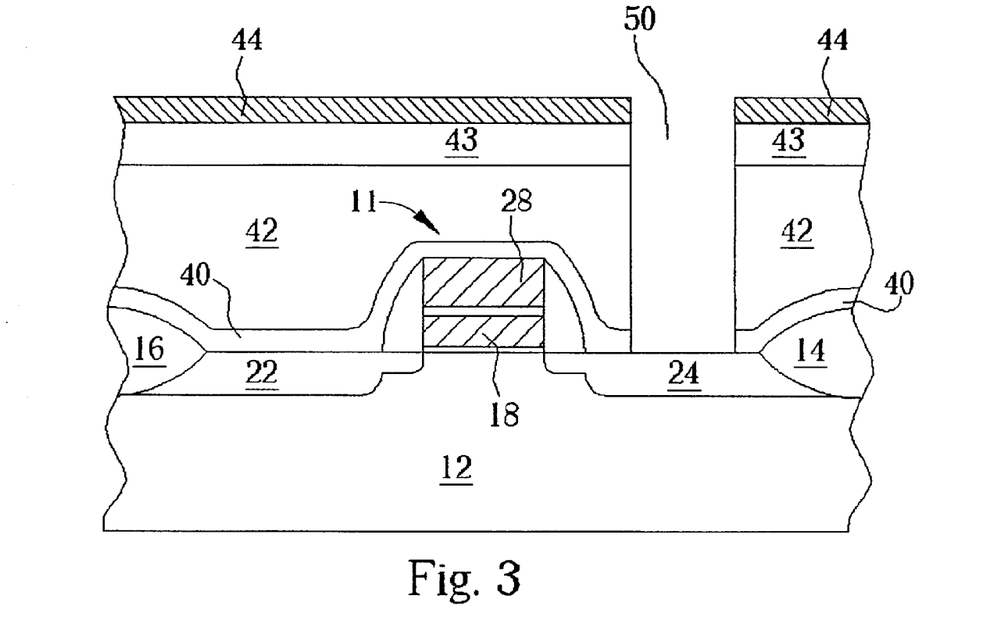

As shown in FIG. 3, a photolithographic process and an etching process are sequentially performed. A contact hole 50, having a width ranging from 0.2 to 0.3 micrometers is thus formed to penetrate through the barrier layer 44, the oxide layer 43, the gettering layer 42 and the blocking layer 40, down to the surface of the drain 24. The barrier layer 44, oxide layer 43, gettering layer 42 and blocking layer 40 can be etched by a single etcher with respective etching gases. Alternatively, they can be etched by different etchers.

Figure 4:
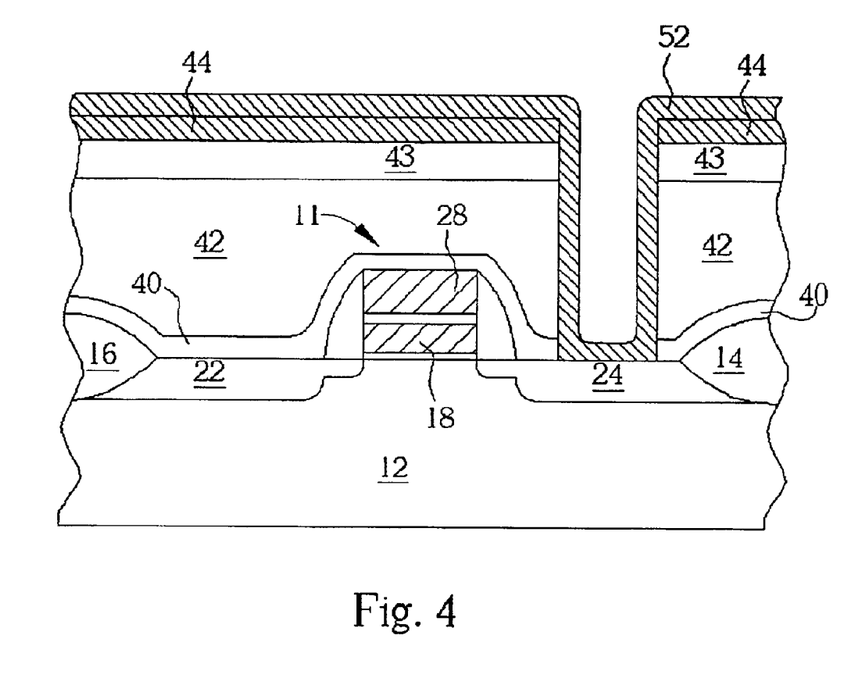

As shown in FIG. 4, a barrier layer 52 is deposited on the surfaces of both the barrier layer 44 and the contact hole 50. The barrier layer 52 is made from silicon oxy-nitride, silicon nitride, or materials that can prevent diffusion of the mobile atoms. In the present invention, silicon oxy-nitride is preferred to form the barrier layer 52. The silicon oxy-nitride layer 52 is formed by LPCVD or PECVD, with a mixture of silane, nitrous oxide ($N_2O$) and nitrogen gas as reactive gases, at a reactive pressure of 5 to 6 Torr and a reactive temperature of between 350 and 450° C. Using these process parameters, the silicon oxy-nitride layer 52 is formed with a reflection index (RI) of 248 nm UV light ranging from 2 to 2.4 and a dielectric constant (k) ranging from 0.4 to 0.6. The thickness of the silicon oxy-nitride layer 52 ranges from 100 to 350 angstroms, while a preferred thickness is suggested 200 angstroms. It is worth of note that the barrier layer 44 must be 10% to 50% thicker than the barrier layer 52.

Figure 5:
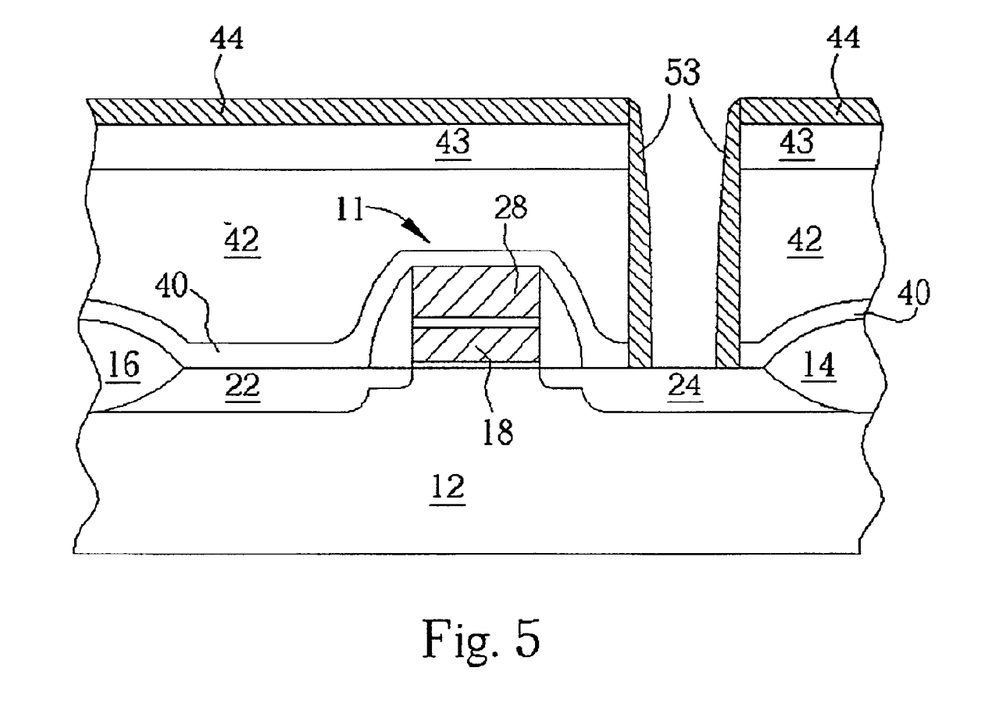
Figure 6:
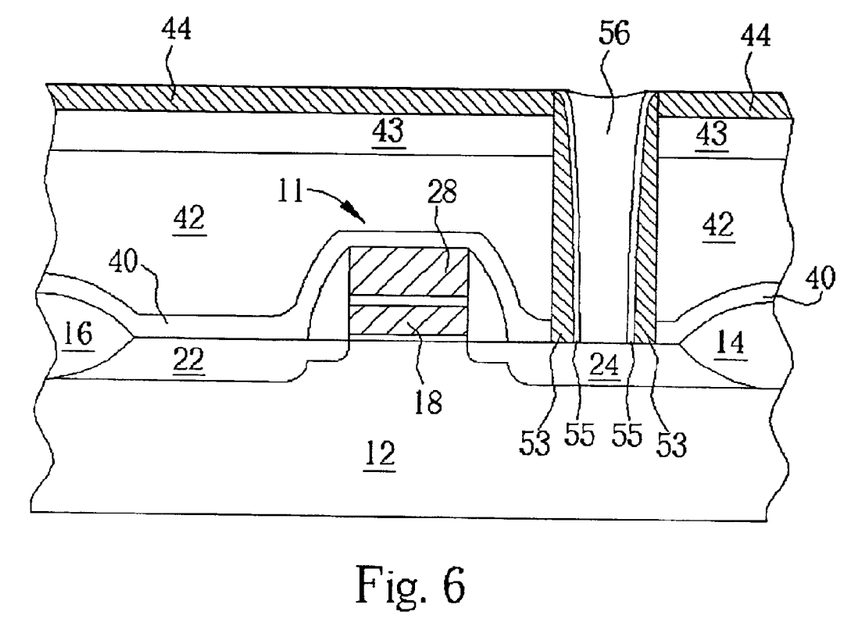

AS shown in FIG. 5, an etching back process is performed to etch the barrier layer 52 to expose the surface of the drain 24 as well as to form a barrier spacer 53 on each side wall of the contact hole 50. The barrier spacer 53 is at least 100 angstroms in thickness. Following that, as shown in FIG. 6, an adhesive layer 55 is formed on the surfaces of the barrier layer 44 and the barrier spacer 53. The adhesive layer 55 can be a composite layer of TiN/Ti, or formed by other adhesive materials. Finally, a contact plug process is performed, using CVD to fill tungsten within the contact hole 50 and removing portions of tungsten outside the contact hole 50, and so finish fabrication of the contact plug 56.

A method to remove tungsten outside the contact hole 50 is performing an etching back process to selectively remove tungsten and stop etching on the surface of the adhesive layer 55. After completing the contact plug 56, a metal layer (not shown) is formed to cover the entire surface of the silicon substrate 12. The metal layer is then patterned, removing a portion of the metal layer and the adhesive layer 55 outside the contact plug 56 and exposing the barrier layer 44 outside the contact plug 56 to prevent diffusion of the mobile ions into the memory device.

Furthermore, the present invention may remove tungsten outside the contact plug 56 by a CMP. As the CMP slurry includes sodium ions, potassium ions and other mobile ions to induce charge loss in the non-volatile memory device, the barrier layer 44 is used as a polishing stop layer for the CMP to prevent the mobile ions from contacting the oxide layers and prevent diffusion of the mobile ions into the memory device.

Figure 7:
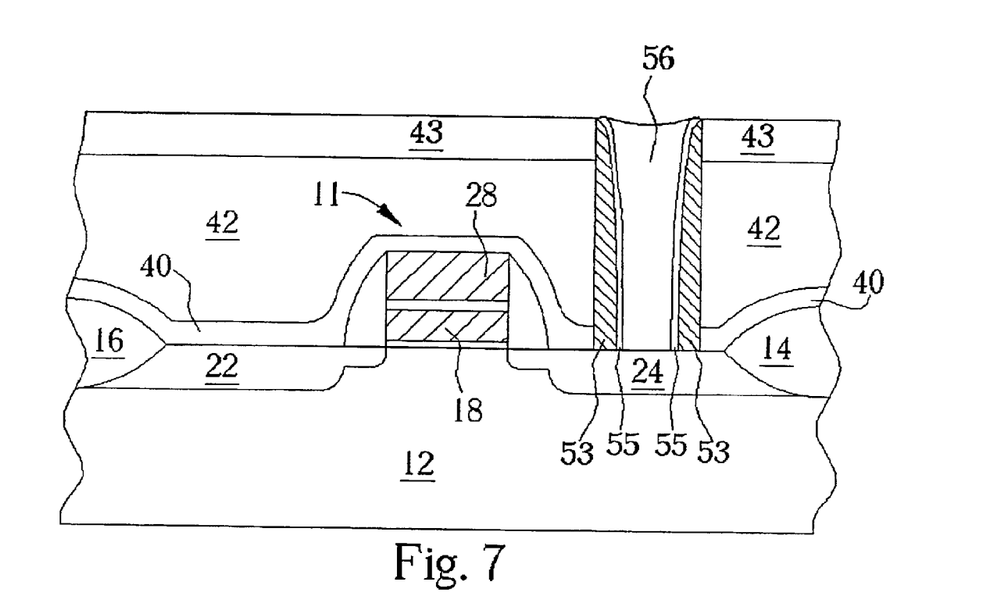
FIG. 7 is a schematic diagram of a second embodiment of the present invention.

Please refer to FIG. 7 of a schematic diagram of a second embodiment of the present invention. After removal of portions of tungsten to complete the contact plug 56 shown in FIG. 6, a planarization process, such as an etching back or CMP process, is selectively performed to remove the barrier layer 44, the adhesive layer 55 and the barrier spacer 53 down to the surface of the oxide layer 43.

Figure 8:
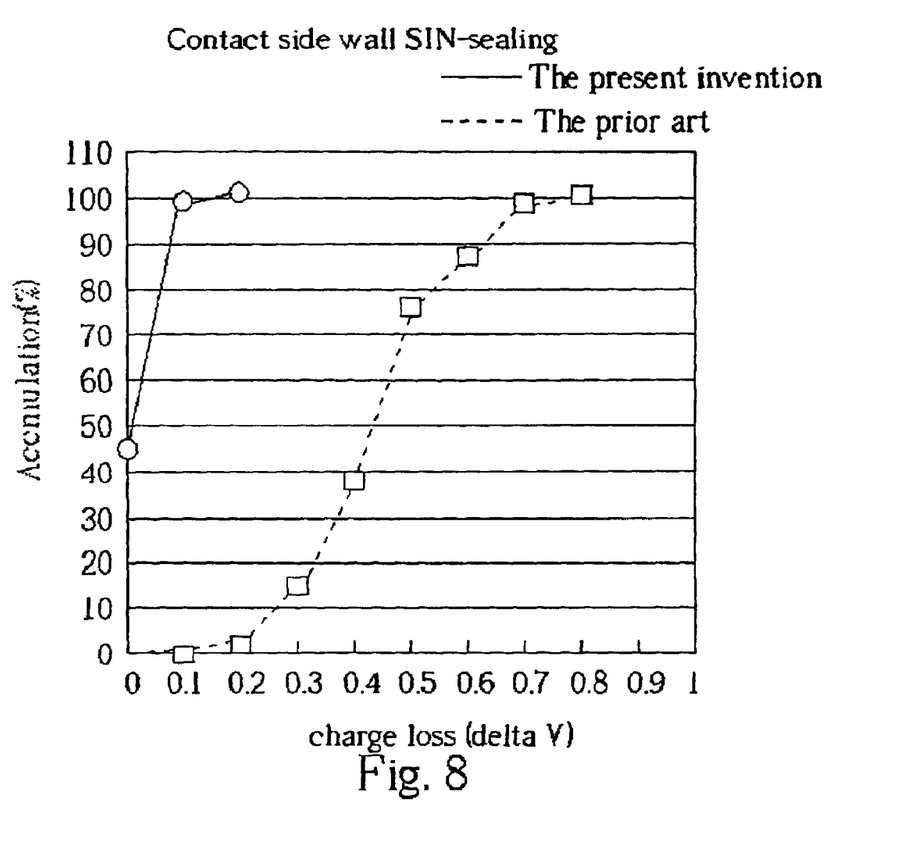
FIG. 8 is a comparative diagram of charge loss between the non-volatile memory of the present invention and the non-volatile memory of the prior art.

Please refer to FIG. 8 of a comparative diagram of charge loss between the non-volatile memory of the present invention and the non-volatile memory of the prior art. As shown in FIG. 8, under a contact side wall sealing test, the non-volatile memory of the present invention uses the barrier spacer 53 to effectively reduce the charge loss, thus greatly improving the electrical performance of the non-volatile memory.

In contrast to the prior art, the method of the present invention uses the barrier layer 44 to prevent vertical diffusion of mobile atoms from above the barrier layer 44 into the stacked gate 11. In addition, the barrier spacer 53 prevents a lateral diffusion of mobile atoms from the contact hole 50 or the contact plug 56 into the stacked gate 11. As a result, the method of the present invention can effectively prevent the mobile atoms, including free hydrogen atoms and water vapor, from diffusing into the stacked gate 11 to prevent a charge loss within the floating gate.

In a brief, the present invention has the advantages of:(1)effectively preventing effects of mobile atoms in the memory device, especially in the floating gate;(2) eliminating an unnecessary high-temperature annealing process; and(3)decreasing the thickness of the gettering layer 42 so as to decrease the aspect ratio of the contact hole.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a memory device on a semiconductor substrate, the surface of the semiconductor substrate comprising a stacked gate, a source and a drain positioned within the semiconductor substrate on either side of the stacked gate, the method comprising:

forming a blocking layer on the semiconductor substrate to cover the stacked gate, the source and the drain;

forming a gettering layer on the blocking layer;

planarizing the gettering layer down to a predetermined thickness;

forming a first barrier layer on the gettering layer;

forming a contact hole, the contact hole penetrating through the first barrier layer, the gettering layer and the blocking layer down to the surface of the source, the drain or the stacked gate;

forming a second barrier layer to cover the first barrier layer and the contact hole; and etching back the second barrier layer to form a barrier spacer on the side wall of the contact hole.

2. The method of claim 1 wherein the first barrier layer or the second barrier layer comprises silicon oxy-nitride or silicon nitride.

3. The method of claim 1 wherein a thickness of the first barrier layer ranges from 300 to 1000 angstroms (Å).

4. The method of claim 1 wherein a refraction index (RI) of 248 nm UV light on the first barrier layer or the second barrier layer ranges from 2 to 2.4.

5. The method of claim 1 wherein a dielectric constant (k) of the first barrier layer or the second barrier layer ranges from 0.4 to 0.6.

6. The method of claim 1 wherein a thickness of the second barrier layer ranges from 100 to 350 Å.

7. The method of claim 1 wherein the stacked gate comprises a floating gate, an ONO dielectric layer positioned on the floating gate, and a control gate positioned on the ONO dielectric layer.

8. The method of claim 1 wherein a thickness of the gettering layer ranges from 13K to 15K Å.

9. The method of claim 1 wherein the gettering layer comprises PSG or BPSG.

10. The method of claim 1 wherein the predetermined thickness ranges from 7K to 9K Å.

11. The method of claim 1 wherein the semiconductor substrate is a silicon substrate.

12. The method of claim 1 wherein after the second barrier layer is etched back, the method further comprises:

forming an adhesive layer on the surfaces of the first barrier layer and the barrier spacer;

performing a contact plug process to fill a metal material within the contact hole; and etching back the metal material to form a contact plug within the contact hole.

13. The method of claim 12 wherein the metal material is tungsten (W).

14. The method of claim 1 wherein the first barrier layer is 10% to 50% thicker than the second barrier layer.

15. The method of claim 1 wherein the blocking layer is at least one selected from the group consisting of undoped silicate glass (USG), LP-TEOS, and PE-TEOS.

16. The method of claim 1 wherein after the second barrier layer is etched back, the method further comprises:

forming an adhesive layer on the surfaces of the first barrier layer and the barrier spacer;

performing a contact plug process to fill a metal material within the contact hole; and etching back the metal material, the adhesive layer and the second barrier layer to form a contact plug within the contact hole.

17. The method of claim 16 wherein the metal material is tungsten (W).

* * * * *